United States Patent
Hoeppel et al.

(10) Patent No.: US 11,527,521 B2
(45) Date of Patent: Dec. 13, 2022

(54) COMPOSITE SEMICONDUCTOR COMPONENT HAVING PROJECTING ELEMENTS PROJECTING FROM A CARRIER SUBSTRATE AND METHOD FOR PRODUCING THE COMPOSITE SEMICONDUCTOR COMPONENT

(71) Applicant: OSRAM OLED GmbH, Regensburg (DE)

(72) Inventors: Lutz Hoeppel, Alteglofsheim (DE); Alexander Pfeuffer, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 46 days.

(21) Appl. No.: 16/968,498

(22) PCT Filed: Feb. 14, 2019

(86) PCT No.: PCT/EP2019/053721
§ 371 (c)(1),
(2) Date: Aug. 7, 2020

(87) PCT Pub. No.: WO2019/158657
PCT Pub. Date: Aug. 22, 2019

(65) Prior Publication Data
US 2020/0411493 A1 Dec. 31, 2020

(30) Foreign Application Priority Data
Feb. 16, 2018 (DE) .......................... 102018103505.5

(51) Int. Cl.
*H01L 25/16* (2006.01)
*H01L 23/00* (2006.01)

(52) U.S. Cl.
CPC ............ *H01L 25/167* (2013.01); *H01L 24/03* (2013.01); *H01L 24/05* (2013.01); *H01L 24/29* (2013.01);
(Continued)

(58) Field of Classification Search
CPC ..... H01L 33/62; H01L 33/486; H01L 25/167; H01L 24/03; H01L 24/05; H01L 24/29;
(Continued)

(56) References Cited

U.S. PATENT DOCUMENTS 5,472,914 A   12/1995   Martin et al.
5,789,278 A    8/1998   Akram et al.
(Continued)

FOREIGN PATENT DOCUMENTS

DE   102008006757 A1   8/2009
EP       0213774 A1   3/1987
EP       1176641 A2   1/2002

OTHER PUBLICATIONS

Carl Prevatte, et al., "Pressure activated interconnection of micro transfer printed components," Applied Physics Letters 108, 203503 doi: 10.1063/1.4950992, 6 Pages, May 18, 2016.

*Primary Examiner* — Khiem D Nguyen
(74) *Attorney, Agent, or Firm* — Slater Matsil, LLP

(57) ABSTRACT

In an embodiment a composite semiconductor component includes a carrier substrate having a plurality of projecting elements projecting from a first main surface of the carrier substrate, an electrically conductive material electrically conductively connected to a contact region of the carrier substrate and located on at least one of the projecting elements, some of the projecting elements not being covered with the electrically conductive material and a semiconductor chip arranged on the carrier substrate and having at a first surface at least one contact pad electrically connected to the (Continued)

electrically conductive material on at least one element, wherein, at a position at which the contact pad and the electrically conductive material on the projecting element are in each case in contact with one another, the contact pad has a larger lateral extent than the projecting element in each case.

15 Claims, 11 Drawing Sheets

(52) U.S. Cl.
CPC .............. *H01L 24/32* (2013.01); *H01L 24/83* (2013.01); *H01L 2224/03011* (2013.01); *H01L 2224/05558* (2013.01); *H01L 2224/05568* (2013.01); *H01L 2224/29028* (2013.01); *H01L 2224/32148* (2013.01); *H01L 2224/83862* (2013.01); *H01L 2224/83874* (2013.01)

(58) Field of Classification Search
CPC ...................... H01L 24/32; H01L 24/83; H01L 2224/03011; H01L 2224/05558; H01L 2224/05568; H01L 2224/29028; H01L 2224/32148; H01L 2224/83862; H01L 2224/83874; H01L 2224/81; H01L 33/0079; H01L 24/32148; H01L 2224/030311; H01L 2933/0033; H01L 2933/0066
USPC ......................................................... 257/737
See application file for complete search history.

(56) References Cited

U.S. PATENT DOCUMENTS

| | | | |
|---|---|---|---|
| 8,573,469 B2 | 11/2013 | Hu et al. | |
| 8,933,433 B2 | 1/2015 | Higginson et al. | |
| 9,281,280 B2* | 3/2016 | Schelling | H01L 24/27 |
| 9,397,063 B2* | 7/2016 | Haba | H01L 24/17 |
| 2002/0027022 A1* | 3/2002 | Moriizumi | H01L 23/49833 |
| | | | 174/267 |
| 2004/0004291 A1 | 1/2004 | Hirose | |
| 2004/0233649 A1 | 11/2004 | Honlein et al. | |
| 2009/0173955 A1* | 7/2009 | Kim | H01L 25/0756 |
| | | | 257/89 |
| 2009/0289360 A1* | 11/2009 | Takahashi | H05K 1/111 |
| | | | 257/737 |
| 2010/0164098 A1* | 7/2010 | Kuechenmeister | H01L 24/11 |
| | | | 257/E23.06 |
| 2011/0101518 A1* | 5/2011 | Cho | H01L 24/05 |
| | | | 257/E21.59 |
| 2013/0009196 A1* | 1/2013 | Iwanaga | H01L 33/382 |
| | | | 257/99 |
| 2015/0249060 A1* | 9/2015 | Gregorich | H01L 24/16 |
| | | | 257/741 |
| 2016/0027752 A1* | 1/2016 | Chuang | H01L 24/13 |
| | | | 257/738 |
| 2016/0365702 A1* | 12/2016 | Bower | H01S 5/32 |
| 2017/0358557 A1* | 12/2017 | Chen | H01L 25/50 |
| 2018/0114704 A1* | 4/2018 | Wang | H01L 21/4889 |

* cited by examiner

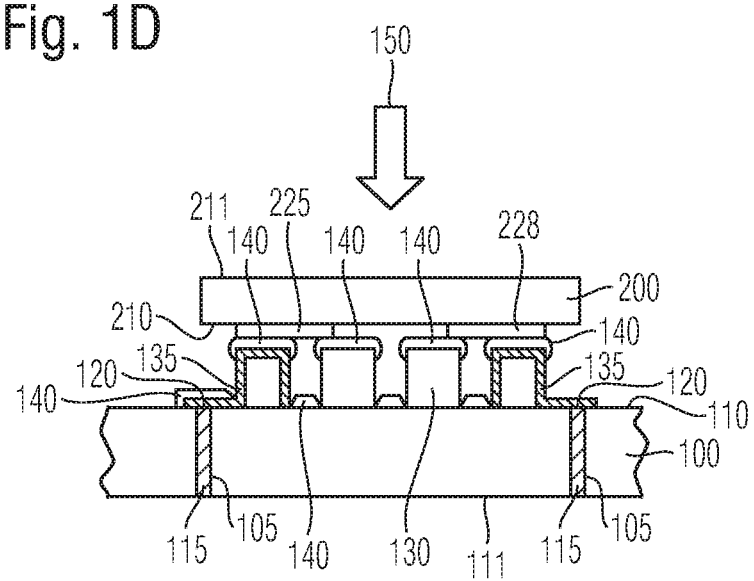

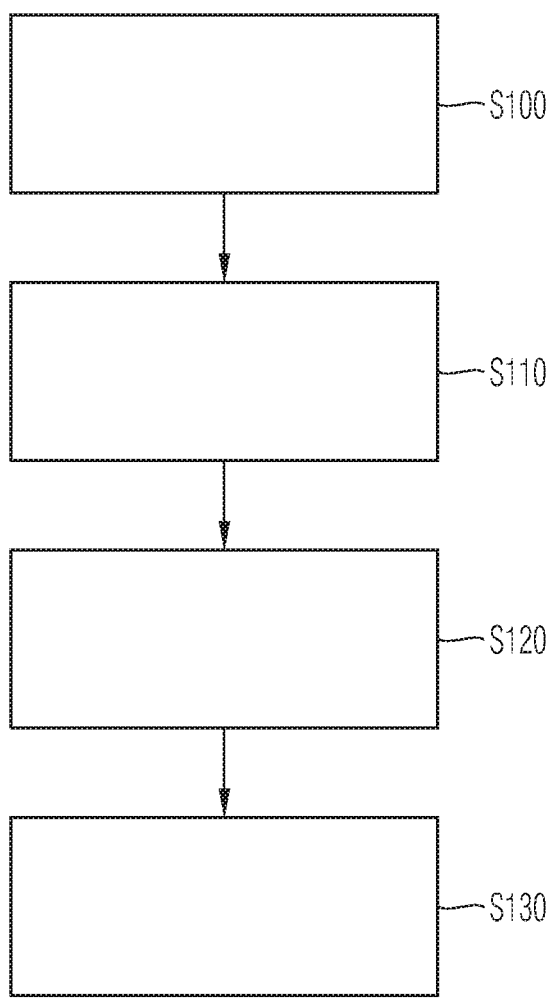

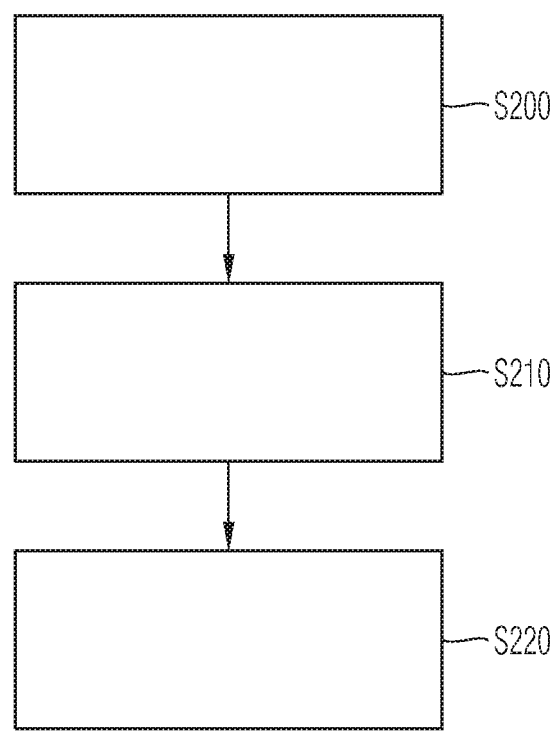

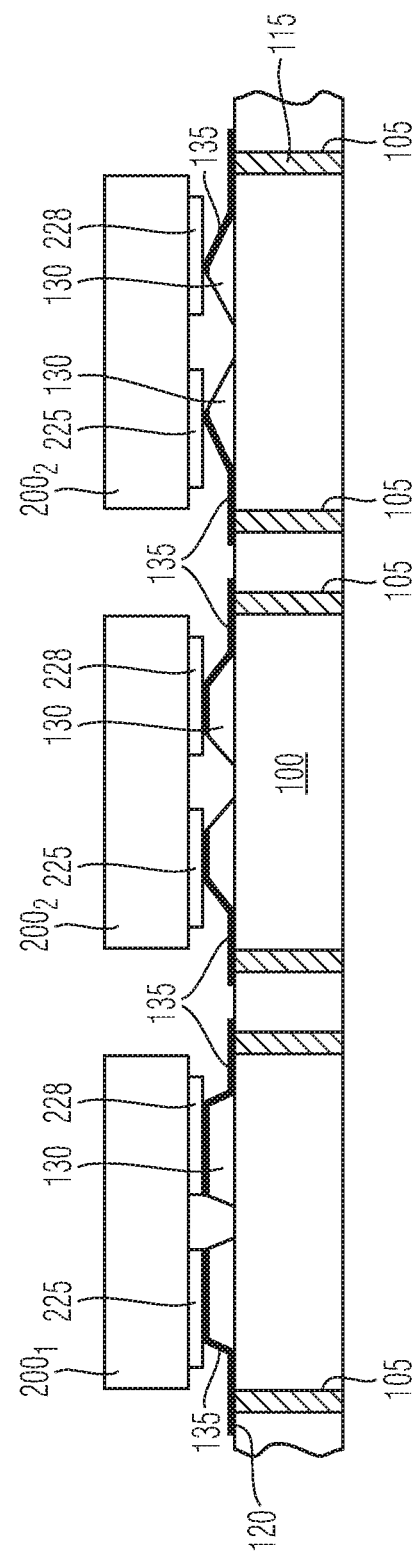

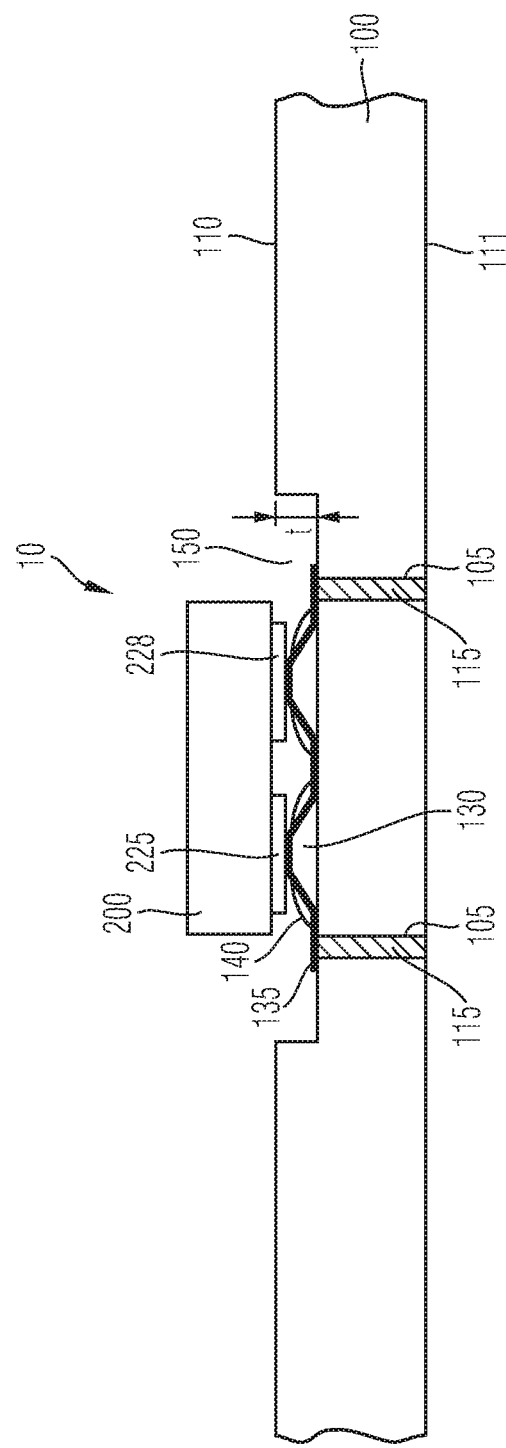

COMPOSITE SEMICONDUCTOR COMPONENT HAVING PROJECTING ELEMENTS PROJECTING FROM A CARRIER SUBSTRATE AND METHOD FOR PRODUCING THE COMPOSITE SEMICONDUCTOR COMPONENT

This patent application is a national phase filing under section 371 of PCT/EP2019/053721, filed Feb. 14, 2019, which claims the priority of German patent application 10 2018 103 505.5, filed Feb. 16, 2018, each of which is incorporated herein by reference in its entirety.

BACKGROUND

During the production of complex semiconductor components, functional elements, for example light emitting diodes (LEDs), can be transferred to a carrier substrate. By way of example, microelectronic circuits can be provided in the carrier substrate. The carrier substrate can be silicon-based, while the LEDs are produced from a different semiconductor material than silicon. A mechanical linking of the semiconductor chip on the carrier substrate takes place during this transfer. At the same time it is desirable to form reliable electrical connections between the transferred semiconductor chip and the carrier substrate during the transfer.

SUMMARY

Embodiments provide an improved composite semiconductor component and an improved method for producing a composite semiconductor component.

A composite semiconductor component comprises a carrier substrate composed of a semiconductor material, and a semiconductor chip arranged on the carrier substrate. The carrier substrate has an element projecting from a first main surface of the carrier substrate and comprising an electrically conductive material, which is electrically conductively connected to a contact region of the carrier substrate. The semiconductor chip has at a first surface at least one contact pad that is electrically connected to the electrically conductive material of the projecting element. At a position at which the contact pad and the electrically conductive material of the projecting element are in each case in contact with one another, the contact pad has a larger lateral extent than the projecting element.

The composite semiconductor component furthermore comprises an adhesive that is arranged between the semiconductor chip and the carrier substrate and is suitable for mechanically connecting the semiconductor chip and the carrier substrate.

An aspect ratio of diameter to height of the projecting element can be 0.3 to 3.

By way of example, the projecting element is produced from an insulating material. The electrically conductive material is arranged as a structured layer over the projecting element.

By way of example, the semiconductor chip can contain active regions of an optoelectronic component that have been detached from a growth substrate. By way of example, a plurality of projecting elements can be provided per contact pad of the semiconductor chip.

In accordance with embodiments, the composite semiconductor component can comprise a multiplicity of projecting elements, at least one of which is arranged at a position outside the contact pads of the semiconductor chip.

In accordance with embodiments, a depression can be formed in the first main surface of the carrier substrate, and the projecting elements are positioned in the depression.

A method for producing a composite semiconductor component comprising a carrier substrate composed of a semiconductor material, and a semiconductor chip arranged on the carrier substrate, comprises forming an element projecting from a first main surface of the carrier substrate and comprising an electrically conductive material, which is electrically conductively connected to a contact region of the carrier substrate, thus resulting in a workpiece surface. An adhesive layer is formed over the workpiece surface. The semiconductor chip having at least one contact pad at a first surface is joined together with the carrier substrate. The adhesive is cured, wherein the electrically conductive material of the projecting element is electrically connected to the associated contact pad of the semiconductor chip. At a position at which the contact pad and the electrically conductive material of the projecting element are in contact with one another, the contact pad has a larger lateral extent than the projecting element.

Forming the projecting element can comprise applying the electrically conductive material at predetermined positions.

By way of example, first surfaces of a multiplicity of semiconductor chips can be joined together simultaneously with the carrier substrate by means of a micro transfer method.

A further method for producing a composite semiconductor component comprising a carrier substrate, and a semiconductor chip arranged on the carrier substrate, comprises forming a multiplicity of projecting elements on a first main surface of the carrier substrate and forming an electrically conductive material, which is electrically conductively connected to a contact region, on at least one of the projecting elements. A contact pad of the semiconductor chip is brought into contact with the electrically conductive material, wherein at a position at which the contact pad and the electrically conductive material of the projecting element are in contact with one another, the contact pad has a larger lateral extent than the projecting element.

By way of example, the projecting elements can be produced from an insulating material, and the electrically conductive material is formed as a structured layer over the projecting elements.

At least one of the projecting elements can be formed at a position outside the contact pad of the semiconductor chip.

A composite semiconductor component comprises a carrier substrate, and a semiconductor chip arranged on the carrier substrate, wherein the carrier substrate has a multiplicity of elements projecting from a first main surface of the carrier substrate. An electrically conductive material is electrically conductively connected to a contact region of the carrier substrate and formed on at least one of the projecting elements. The semiconductor chip has at a first surface at least one contact pad that is electrically connected to the electrically conductive material on at least one element. At a position at which the contact pad and the electrically conductive material on the projecting element are in each case in contact with one another, the contact pad has a larger lateral extent than the projecting element in each case.

The semiconductor chip can contain active regions of an optoelectronic component that have been detached from a growth substrate.

By way of example, a depression can be formed in the first main surface of the carrier substrate, and the projecting elements are positioned in the depression.

An electrical device can comprise the composite semiconductor component as described above. By way of example, the electrical device can be a photovoltaic, photonic, data storage, sensor, illumination, biomimetic and biocompatible device.

BRIEF DESCRIPTION OF THE DRAWINGS

The accompanying drawings serve to afford an understanding of exemplary embodiments of the invention. The drawings illustrate exemplary embodiments and together with the description serve for elucidating same. Further exemplary embodiments and numerous advantages from among those intended are directly evident from the following detailed description. The elements and structures shown in the drawings are not necessarily illustrated in a manner true to scale with respect to one another. Identical reference signs refer to identical or mutually corresponding elements and structures.

FIG. 1D shows a cross-sectional view of a carrier substrate with semiconductor chip;

FIG. 2A illustrates a method for producing a composite semiconductor component in accordance with one or more embodiments;

FIG. 2B illustrates a method for producing a composite semiconductor component in accordance with one or more embodiments;

FIG. 4A shows a cross-sectional view of a composite semiconductor component in accordance with further embodiments;

FIG. 4C shows a cross-sectional view of a composite semiconductor component in accordance with further embodiments.

DETAILED DESCRIPTION OF ILLUSTRATIVE EMBODIMENTS

Figure 1A:
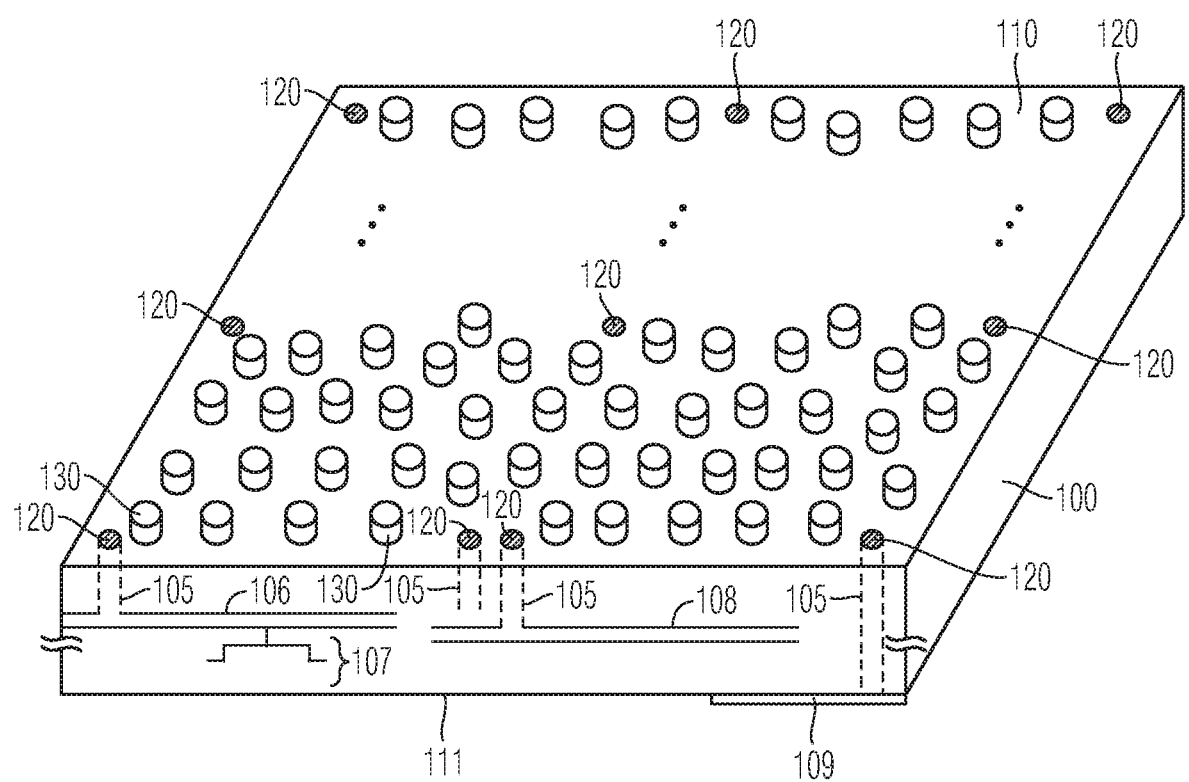
FIG. 1A shows a perspective view of a carrier substrate with a multiplicity of projecting elements.

In the following detailed description, reference is made to the accompanying drawings, which form part of the disclosure and show specific exemplary embodiments for illustration purposes. In this context, a direction terminology such as "top side", "bottom", "front side", "rear side", "on", "over", "at the front", "at the back" etc. is referenced relative to the orientation of the figures currently being described. Since the component parts of the exemplary embodiments can be positioned in different orientations, the direction terminology serves only for explanation and is not in any way restrictive.

The description of the exemplary embodiments is not restrictive since other exemplary embodiments also exist and structural or logical changes can be made, without in so doing departing from the scope defined by the patent claims. In particular, elements of exemplary embodiments described below can be combined with elements of other exemplary embodiments from among those described, provided that nothing to the contrary is evident from the context.

The terms "wafer", "substrate" or "semiconductor substrate" used in the following description can encompass any semiconductor-based structure having a semiconductor surface. Wafer and structure should be understood to include doped and undoped semiconductors, epitaxial semiconductor layers, carried by a base semiconductor support, and further semiconductor structures. By way of example, a layer composed of a first semiconductor material can be grown on a growth substrate composed of a second semiconductor material. Depending on the purpose of use, the semiconductor can be based on a direct or an indirect semiconductor material. Examples of semiconductor materials that are particularly suitable for generating electromagnetic radiation comprise in particular nitride semiconductor compounds, which can generate for example ultraviolet light, blue light or light of longer wavelength, such as, for example, GaN, InGaN, AN, AlGaN, AlGaInN, phosphide semiconductor compounds, which can generate for example green light or light of longer wavelength, such as, for example, GaAsP, AlGaInP, GaP, AlGaP, and also further semiconductor materials such as AlGaAs, SiC, ZnSe, GaAs, ZnO, $Ga_2O_3$, diamond, hexagonal BN and combinations of the materials mentioned. The stoichiometric ratio of the ternary compounds can vary. Further examples of semiconductor materials can comprise silicon, silicon-germanium and germanium. In the context of the present description, the term "semiconductor" also includes organic semiconductor materials.

In the context of the present description, the term "optoelectronically active semiconductor layers" relates to those layers of the optoelectronic device which generate the electromagnetic radiation emitted by the optoelectronic device. By way of example, the optoelectronic semiconductor layers can comprise any type of semiconductor layer sequences which are suitable for emitting electromagnetic radiation. Specific examples comprise, inter alia, a pn junction, a double heterostructure, a single quantum well structure, a multi quantum well structure and/or a quantum cascade structure. The term "optoelectronic chip" relates to a stack of optoelectronically active semiconductor layers that can optionally be carried by a growth or carrier substrate. In accordance with further embodiments, the term "optoelectronically active semiconductor layer" also relates to those layers of the optoelectronic device which absorb electromagnetic radiation.

The terms "lateral" and "horizontal", as used in this description, are intended to describe an orientation or alignment which runs substantially parallel to a first surface of a semiconductor substrate or semiconductor body. This can be for example the surface of a wafer or of a die or of a chip.

The term "vertical", as used in this description, is intended to describe an orientation that runs substantially perpendicular to the first surface of the semiconductor substrate or semiconductor body.

Insofar as the terms "have", "contain", "encompass", "comprise" and the like are used, they are open terms which indicate the presence of the stated elements or features but do not exclude the presence of further elements or features. The indefinite articles and the definite articles encompass both the plural and the singular, provided that nothing to the contrary is clearly evident from the context.

In the context of this description, the term "electrically connected" denotes a low-resistance electrical connection between the connected elements.

In the context of this description, the term composite semiconductor component denotes an assembled semiconductor component comprising a semiconductor chip arranged on a carrier substrate. If the carrier substrate is a semiconductor substrate, then the semiconductor material of semiconductor substrate and semiconductor chip can be in each case different or else identical. By way of example, the semiconductor substrate can be a silicon substrate in which circuit component parts for driving the semiconductor chip or processing signals supplied by the semiconductor chip are arranged. The carrier substrate can also be constructed from an insulating material, for example. The composite semiconductor component can contain one or a plurality of semiconductor chips.

FIG. 1A shows a perspective view of a part of a carrier substrate 100. In accordance with one or more embodiments, the carrier substrate can comprise a semiconductor material. By way of example, circuit component parts 107 can be formed in or on a first main surface 110 of the carrier substrate 100. Circuit component parts 107 can comprise for example transistors, diodes, capacitors, active or passive component parts of semiconductor components. The circuit component parts 107 can be connected to a through contact 105 by way of conductive regions 106, for example. The through contact 105 can be filled with an electrically conductive material 115 (illustrated in FIG. 1D). The through contact 105 can be electrically connected to a contact region 120 arranged on the first main surface 110 of the carrier substrate 100. Furthermore, conductor tracks 108 can be formed in or on one of the main surfaces 110, 11 of the carrier substrate 100. The conductor tracks 108 can be connected to through contacts or via contacts 105. In accordance with configurations, the through contacts 105 can be led from the first main surface 110 as far as a second main surface 11 of the carrier substrate 100. However, it is also possible for the through contacts 105 to be connected for example to conductor tracks 108 or conductive regions 106 arranged within the carrier substrate 100 for example.

In accordance with further configurations, however, the carrier substrate 100 can also be constructed from one or a plurality of insulating materials. By way of example, the carrier substrate can act as an interface or redistribution layer between the semiconductor chip to be applied and further components on which the carrier substrate 100 is to be applied. By way of example, a rear-side metallization 109 can be arranged on the second main surface in of the carrier substrate.

The carrier substrate 100 illustrated in FIG. 1A is dimensioned for example in such a way that in a subsequent method step for applying semiconductor chips, a plurality of semiconductor chips can be applied on said carrier substrate.

A multiplicity of projecting elements 130 are formed on the first main surface 110 of the carrier substrate 100. The projecting elements 130 can have a kind of pimple structure, for example. The pimple structure can be in the form of sawn-off columns, which can be embodied in a cylindrical or conical fashion. The cross-sectional area of the projecting elements 130 can be circular, oval, but also polygonal, in particular approximately quadrilateral, for example with rounded corners. In a cross-sectional view taken perpendicular to the first main surface 110, the shape of the projecting elements can be rectangular, trapezoidal or else triangular. The cross-sectional view along a first plane running perpendicular to the first main surface 110 can be different than a second cross-sectional view, which intersects the first cross-sectional view. In other words, the projecting elements can be rotationally symmetrical or non-rotationally symmetrical in relation to a respective element axis perpendicular to the first main surface.

An aspect ratio of diameter to height of the projecting elements can be 0.3 to 3, for example. The distance between the projecting elements can vary depending on the application and in particular depending on the number of projecting elements per semiconductor chip, which will also be discussed later. By way of example, the distance between adjacent projecting elements can correspond approximately to the diameter of the projecting elements. This can be the case, for example, if a multiplicity of projecting elements 130, for example more than 4, is provided per semiconductor chip. This can also be the case, for example, if projecting elements 130 are also present at positions corresponding to a position outside the contact pads of the semiconductor chip. However, the distance between adjacent projecting elements 130 can also be a multiple of the diameter of the projecting elements. This can be the case, for example, if not more than four projecting elements are provided per semiconductor chip. This can also be the case if no projecting elements 130 are present at positions corresponding to a position outside the contact pads of the semiconductor chip.

In the context of the present disclosure, "diameter" is understood to mean a lateral dimension, for example the largest lateral dimension, of the projecting elements 130. The projecting elements 130 can be arranged according to a regular pattern. By way of example, the projecting elements 130 can be arranged in rows and columns or else in a checkered pattern. In accordance with further embodiments, however, the projecting elements can also be arranged arbitrarily, i.e., not according to a regular pattern.

The size and shape of the projecting elements 130 also need not necessarily be uniform in each case. The shape and size of the projecting elements can deviate from one another in each case among the projecting elements. The projecting elements 130 can be produced from an insulating material, for example. By way of example, they can be applied by means of an insulating layer being applied over the whole area and can then be structured using a suitable mask. By way of example, a mask that results in an irregular configuration of the projecting elements 130 can be used.

The mask for producing an irregular pimple structure can be produced as follows, for example: a layer of aluminum that is less than 5 nm thick and thus not area-covering is deposited on the layer to be structured. The layer is oxidized during deposition or subsequently by means of oxygen. The resulting nanoscopic $Al_2O_3$ particles bring about a masking for the subsequent dry-chemical etching process of the underlying layer. By way of example, the masking can be particularly effective for a dry-chemical etching process based on fluorene gas, as is customary for an insulating base material.

Figure 1B:
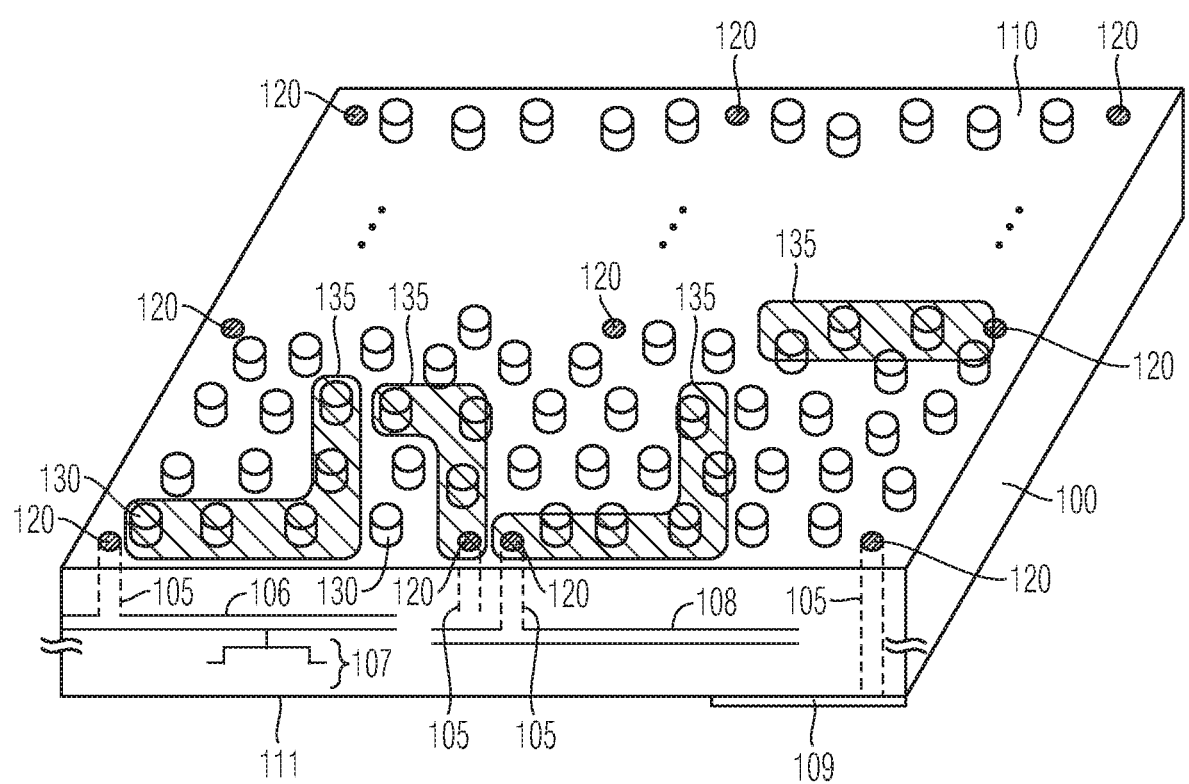
FIG. 1B shows a perspective view of the carrier substrate with applied metallization regions.

A structured conductive material 135 is applied to the carrier substrate 100 shown for example in FIG. 1B. By way of example, a layer composed of a conductive material can be applied over the whole area and can then be structured by means of suitable structuring methods. However, it is also possible for the conductive layer to be applied directly in a structured fashion, i.e., only at selected surface regions. As a result, as illustrated in FIG. 1B, the conductive material is not arranged on all of the projecting elements 130, but rather only on selected projecting elements.

By way of example, the conductive material can comprise a plurality of layers. The conductive material can contain a metal or a metal compound. For example, firstly an adhesion promoter layer, for example a titanium-containing layer, can be formed. A customary conductive material such as, for example, tungsten, copper, aluminum, platinum, palladium, chromium, nickel or a compound composed of these materials can then be applied. Afterward, for example, a gold layer can be formed as a terminating layer. The position of the structured conductive material 135 can be formed taking account of the position of the contact pads of a semiconductor chip to be applied. FIG. 1B shows a perspective view of the carrier substrate 100 with the structured conductive material 135. A surface of the carrier substrate 100 with structured conductive material 135, which surface arises as a result of this processing, corresponds to a workpiece surface. A layer thickness of the conductive material 135 can be for example approximately 50 to 200 nm.

Figure 1C:
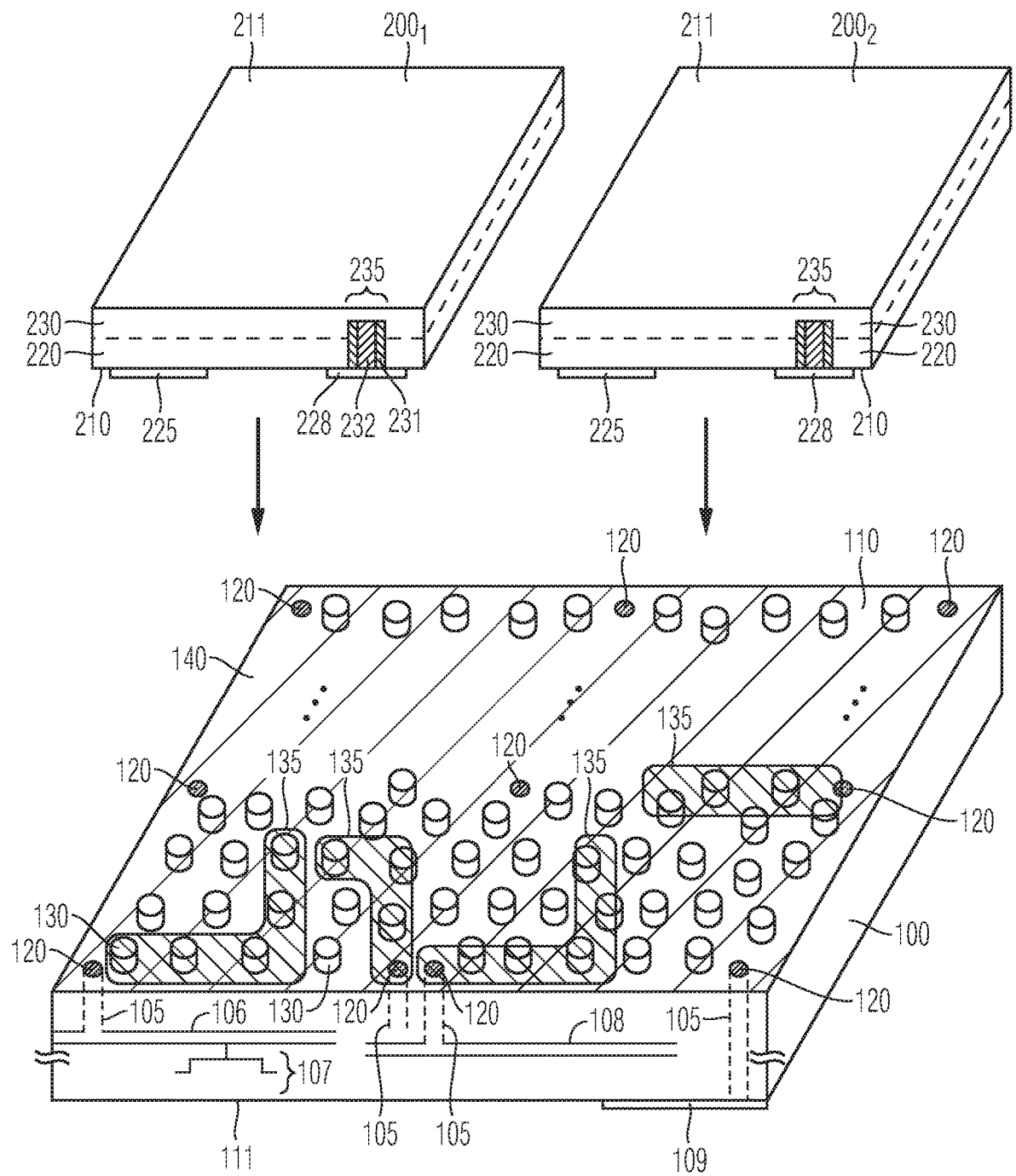
FIG. 1C illustrates the process of applying two semiconductor chips on the carrier substrate.

Afterward, as illustrated in FIG. 1C, semiconductor chips $200_1, 200_2, \ldots 200_n$ are applied to the carrier substrate 100. The semiconductor chips $200_1, \ldots 200_n$ can be optoelectronic semiconductor chips for example. The semiconductor chips 200 need not be identical to one another in each case. By way of example, semiconductor chip $200_1$ can be an LED that emits in a first wavelength range, and semiconductor chip $200_2$ can be an LED that emits in a second wavelength range. It is also possible for the two semiconductor chips to differ in each case in their functionality. By way of example, semiconductor chip $200_1$ can be embodied as an element that emits electromagnetic radiation, while semiconductor chip $200_2$ receives said electromagnetic radiation and is embodied as a sensor, for example. The thickness of the semiconductor chip $200_1, 200_2$ can be for example less than 200 μm, for example less than 100 μm, e.g. 1 to 60 μm.

In accordance with embodiments, the semiconductor chips $200_1, 200_2$ can be configured in such a way that they substantially only contain the optoelectronically active layers 220, 230. During the production of optoelectronic components, the optoelectronically active layers containing for example a semiconductor material suitable for generating or taking up electromagnetic radiation can be grown on a growth substrate and be processed further and singulated into individual semiconductor chips. In accordance with one configuration of a production method, the semiconductor chips can be detached from the growth substrate, such that they contain for example only the optoelectronically active layers 220, 230 but not residues of the growth substrate. By way of example, an exposed surface of the optoelectronically active layer 230 can constitute a second surface 211 of the semiconductor chip 200.

FIG. 1C illustrates as an example that each of the semiconductor chips $200_1, 200_2$ has a first region 220 and a second region 230 arranged thereabove. The first region 220 can be for example a first semiconductor material of a first conductivity type, e.g. p-conducting, and the second region can be a second semiconductor material of a second conductivity type, e.g. n-conducting. The first and the second semiconductor materials can be identical—apart from the conductivity type. The first region 220 can be contacted for example by way of a first contact pad 225 arranged at a first surface 210 of the semiconductor chip 200. Furthermore, the second region 230 of the semiconductor chip can be contacted by way of a second contact pad 228, which is likewise arranged at the first surface 210 of the semiconductor chip, electrically by way of an electrical contact 235 with the second region. By way of example, the electrical contact 235 with the second region can be realized by a contact hole. The contact hole can be lined with an insulating material 231. The interior of the lined contact hole can be filled with a conductive material 232. By way of example, the semiconductor chips $200_1, 200_2$ can be produced using flip-chip technology. By way of example, this can be effected by the first contact pad 225 and the second contact pad 228 being formed on a semiconductor wafer. In accordance with further embodiments, the semiconductor chips $200_1, 200_2$ can also have a plurality of contact pads. By way of example, the semiconductor chips $200_1, 200_2$ can be chips for arbitrary electronic applications and can have a multiplicity of contact pads. After the semiconductor wafer has been singulated into individual chips, the latter are turned over, such that the contact pads 225, 228 are contactable with a first main surface of a carrier substrate.

The semiconductor chips $200_1, 200_2$ can be applied for example successively on the carrier substrate 100. However, it is also possible to transfer them by means of a so-called micro transfer printing method. In accordance with configurations, by means of laser action or using a silicone adhesive stamp, a multiplicity of semiconductor chips can be detached from a growth substrate or a temporary process carrier, and be transferred to the carrier substrate 100.

Irrespective of what transfer technique is employed, before the semiconductor chips are transferred, a nonconductive adhesive can be formed over the workpiece surface. By way of example, the nonconductive adhesive can be an epoxy resin, for example a DOW Intervia 8023-10. It goes without saying, however, that other nonconductive adhesives can also be used. By way of example, the nonconductive adhesive can be applied by means of spin coating or rotary coating. A layer thickness of the nonconductive adhesive can be for example less than 500 nm, e.g. a few 100 nm. This can be achieved by the adhesive being diluted to a suitable viscosity before being applied.

Afterward, the semiconductor chips are applied. In the event of a micro transfer method being used, the correct alignment of the semiconductor chips can be ensured by the use of alignment marks, for example.

For illustrating the joining together process, FIG. 1D shows an enlarged cross-sectional view of carrier substrate 100 and semiconductor chip 200. As described, a multiplicity of projecting elements 130 are formed over a first main surface 110 of the carrier substrate 100. The material of the projecting elements can be for example silicon dioxide, silicon nitride or some other nonconductive material. A structured conductive material 135 is formed for example over selected projecting elements 130. An adhesive layer 140 is arranged over the resulting workpiece surface. Since the layer thickness of the adhesive layer 140 is rather thin, it is not illustrated as a continuous layer, but rather only in spots. The semiconductor chip 200 is applied on the carrier substrate 100. Here the first and second contact pads 225, 228 respectively contact specific projecting elements 130 provided with the conductive material 135. A pressure, illustrated by the arrow 150, can then be exerted on the arrangement comprising semiconductor chip 200 and carrier substrate 100. The adhesive layer 140 situated between the contact pads 225, 228 and the conductive material or the metallization 135 on the projecting elements 130 is displaced as a result of a pressure being exerted.

During the subsequent curing process, the adhesive 140 cures and results in a permanent connection between carrier substrate 100 and semiconductor chip 200. Furthermore, the displacement of the adhesive 140 brings about an electrical contact between the contact pads 225, 228 and the conductive material on the projecting elements 130. Shrinkage of the adhesive usually takes place during the curing of the adhesive 140. As a result, the seated chips 200 can be drawn downward, as a result of which an electrical linking between semiconductor chip and carrier substrate 100 can take place. By way of example, the adhesive can cure by means of thermal or UV processes.

In accordance with embodiments, the projecting elements 130 can be embodied in such a way that a lateral dimension becomes all the larger, the closer the position gets to the vicinity of the carrier substrate 100. In other words, the diameter of the projecting elements 130 where they adjoin the semiconductor chip 200 can be smaller than where they adjoin the carrier substrate 100. In this case, the pressure exerted on the connection location between contact pad 225, 228 and conductive material 135 is also intensified. In accordance with further embodiments, the curing can also be carried out under an oxygen plasma. In this case, a larger proportion of the adhesive between contact pads 225, 228 and the conductive material 135 on the projecting elements 130 is removed. As a consequence, a larger conductive connection area between contact pads and the conductive material can be produced.

As is illustrated in FIG. 1D, predetermined projecting elements 130 situated at predetermined positions are respectively connected to the contact regions 120 byway of the structured conductive material 135.

After semiconductor chip and carrier substrate have been joined together, the carrier substrate can be singulated, for example. By way of example, the carrier substrate can be singulated such that the resulting composite semiconductor component 10 comprises a plurality of semiconductor chips $200_1$, $200_2$, $200_3$. In this case, the semiconductor chips belonging to a composite semiconductor component 10 can be identical or different from one another. It is also possible for composite semiconductor components 10 to contain in each case not more than one semiconductor chip $200_1$, $200_2$, $200_3$.

FIG. 2A summarizes the method in accordance with embodiments. A method for producing a composite semiconductor component comprising a carrier substrate composed of a semiconductor material, and a semiconductor chip arranged on the carrier substrate, comprises forming (S100) an element that projects from a first main surface of the carrier substrate and comprises an electrically conductive material, thus resulting in a workpiece surface. The electrically conductive material is electrically conductively connected to a contact region. The method furthermore comprises forming (S110) an adhesive layer over the workpiece surface. The semiconductor chip having at least one contact pad at a first surface is then joined together with the carrier substrate (S120). Afterward, the adhesive is cured (S130), wherein the electrically conductive material of the projecting element is electrically connected to the associated contact pad of the semiconductor chip. At a position at which the contact pad and the electrically conductive material of the projecting element are in contact with one another, the contact pad has a larger lateral extent than the projecting element.

In accordance with the method shown in FIG. 2B for producing a composite semiconductor component comprising a carrier substrate, and a semiconductor chip arranged on the carrier substrate, a multiplicity of projecting elements are formed on a first main surface of the carrier substrate (S200). An electrically conductive material, which is electrically conductively connected to a contact region, is formed on at least one of the projecting elements (S210). A contact pad of the semiconductor chip is contacted with the electrically conductive material (S220), wherein at a position at which the contact pad and the electrically conductive material of the projecting element are in contact with one another, the contact pad has a larger lateral extent than the projecting element.

Figure 3A:
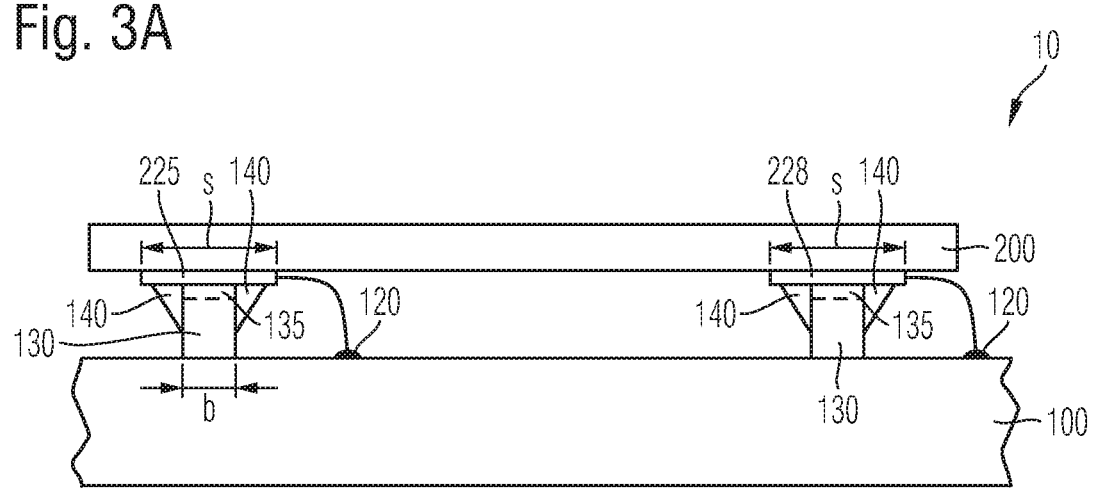
FIG. 3A shows a cross-sectional view of one example of a composite semiconductor component.

FIG. 3A shows one example of a composite semiconductor component 10 in accordance with one or more embodiments, which is producible for example by means of the method illustrated in FIGS. 1 and 2A. In accordance with the embodiment shown in FIG. 3A, a composite semiconductor component 10 comprises a carrier substrate 100 composed of a semiconductor material, and a semiconductor chip 200 arranged on the carrier substrate 100. The carrier substrate has an element projecting from a first main surface 110 of the carrier substrate 100 and comprising a conductive material 135, which is electrically conductively connected to a contact region 120. The semiconductor chip has at a first surface 210 at least one contact pad 225, 228 that is electrically connected to the electrically conductive material 135 of the projecting element 130. At a position at which the contact pad and the conductive material 135 of the projecting element are in each case in contact with one another, the contact pad 225, 228 has a larger lateral extent than the projecting element 130.

Referring to FIGS. 1A to 1D, in particular a multiplicity of projecting elements 130 are described, only selected ones of which are covered with the structured conductive material 135 and connected to a contact region 120 by way thereof.

In accordance with further embodiments, however, it is also possible for only a few projecting elements 130 to be provided on the carrier substrate 100. By way of example, the number of projecting elements 130 can be dimensioned such that for each contact pad 225, 228 of the semiconductor chip 200 there is a predetermined number of projecting elements 130, for example one, of the carrier substrate 100. The projecting element 130 can be produced from an insulating material and be coated with a conductive material 135. By way of example, the conductive material 135 can be connected to a contact region 120 of the carrier substrate 100. In accordance with further embodiments, however, it is also possible for the projecting element 130 itself to be produced from a conductive material. In this case, a part of the projecting element 130 composed of conductive material constitutes the contact region 120. By way of example, no projecting elements 130 are arranged at a position of the carrier substrate 100 that is situated outside the contact pads 225, 228 of the semiconductor chip.

In accordance with the exemplary embodiment in FIG. 3A, the carrier substrate 100 is a semiconductor substrate. By way of example—as indicated in FIG. 1A—circuit component parts are formed in the semiconductor substrate 100. In accordance with the exemplary embodiment illustrated in FIG. 3A, provision can be made of one or alternatively a plurality of projecting elements 130 for electrical connection, wherein for example all the projecting elements 130 comprise a conductive material 135. By way of example, all the projecting elements 130 can be produced from a conductive material or else be connected to a contact region 120 of the carrier substrate 100 composed of a semiconductor material by way of a conductive material 135.

A contact pad 225, 228 of the semiconductor chip 200 has in each case a larger lateral extent s than the projecting element, which has a lateral extent b. The composite semiconductor component 10 illustrated in FIG. 3A can furthermore comprise an adhesive 140 as described above. The latter can be present for example at the sidewalls of the projecting elements 130. Moreover, all other elements can be embodied in a manner similar to that as explained with reference to FIGS. 1A to 1D, with the difference that no projecting elements 130 are provided outside the contact pads 225, 228 of the semiconductor chip 200. By way of example, the aspect ratio of, and the distance between, adjacent projecting elements, provided that provision is made of a plurality of projecting elements for electrically contacting a contact pad of the semiconductor chip, can be configured as described with reference to the previous figures.

Figure 3B:
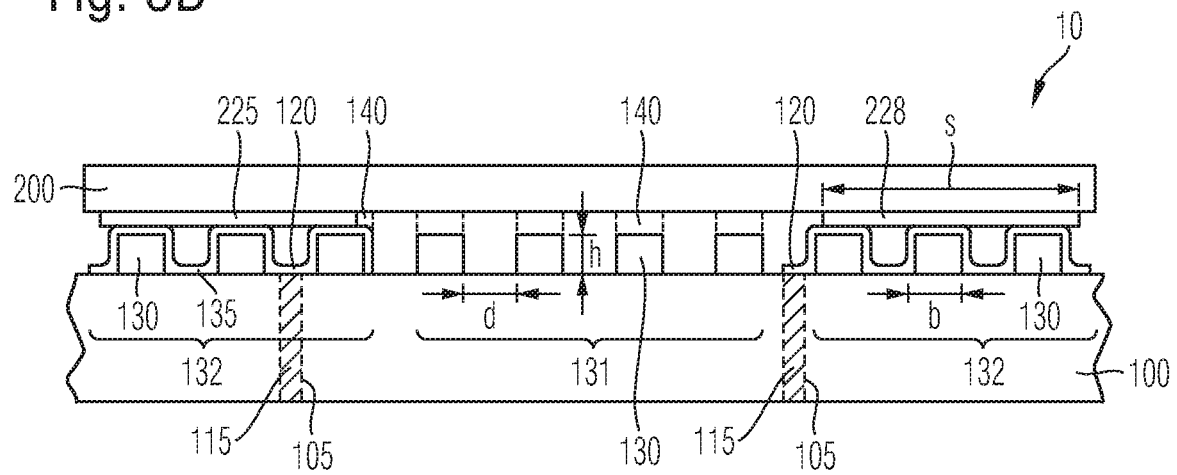
FIG. 3B shows a cross-sectional view of a composite semiconductor component in accordance with further embodiments.

FIG. 3B shows a cross-sectional view of a composite semiconductor component 10 in accordance with one or more further embodiments. The composite semiconductor component shown in FIG. 3B may have been produced for example by means of the method illustrated in FIG. 2B. The composite semiconductor component 10 comprises a carrier substrate 100, and a semiconductor chip 200 arranged on the carrier substrate 100. The carrier substrate has a multiplicity of projecting elements 130 that project from a first main surface 110 of the carrier substrate 100. A conductive material 135, which is electrically conductively connected to a contact region 120, is formed on at least one of the projecting elements 130. The semiconductor chip 200 has at a first surface 210 at least one contact pad 225, 228 that is electrically connected to the conductive material 135 on at least one element 130. At a position at which the contact pad and the conductive material 135 on the projecting element 130 are in each case in contact with one another, the contact pad 225, 228 has a larger lateral extent s than in each case the lateral extent b of the projecting element 130.

By way of example, as illustrated in FIG. 3B, a plurality of projecting elements 130 can be provided for each contact pad 225, 228. However, it is also possible to provide just a single projecting element 130 for each contact pad. Those projecting elements 130 which are in electrical contact with one of the contact pads 225, 228 are also referred to as contacting elements 132. Furthermore, a multiplicity of projecting elements 130 is provided outside the contact pads 225, 228 of the semiconductor chip 200. By way of example, the projecting elements 130 outside the contact pads 225, 228 of the semiconductor chip 200 constitute supporting elements that can serve to mechanically support the semiconductor chip. By way of example, the mechanical stability of the semiconductor chip 200 can be improved by means of these supporting elements 131. This is advantageous for example if the semiconductor chips 200 contain only active layers, for example optoelectronically active layers, because they have been detached from their growth substrate. In this case, they have only a very small thickness of less than 50 µm and can be suitably supported by the projecting elements 130. By virtue of the mechanical support, flexure of the semiconductor chip 200 can be reduced or avoided, as a result of which mechanical stresses and disadvantageous effects brought about thereby can be reduced or avoided.

Moreover, it is possible to bring about a dissipation of heat from the semiconductor chip 200 byway of said supporting elements 131. The projecting elements 130 can be produced by an insulating material, for example. Furthermore, it is possible for the projecting elements 130 to be covered with a conductive layer, which is not connected to a contact region provided for electrically contacting the semiconductor chip, in order to increase the heat dissipation from the semiconductor chip 200. The projecting elements 130 can be fashioned as described with reference to FIGS. 1A to 1D. Supporting elements 131 and contacting elements 132 can be embodied in each case identically to one another, wherein the contacting elements 132 can furthermore be covered with the electrically conductive material 135, thereby bringing about the electrical contact with the contact pads 225, 228 of the semiconductor chip 200.

FIG. 4A shows a cross-sectional view of a composite semiconductor component 10 in accordance with further embodiments. As is illustrated in FIG. 4A, the projecting elements 130 can be formed in each case with a different cross-sectional shape perpendicular to the first main surface 110 of the carrier substrate 100. A different shape of the projecting elements results in each case in a different mechanical support of the applied semiconductor component.

In accordance with the embodiments in FIG. 4A, a composite semiconductor component 10 can have in each case projecting elements 130 of in each case identical shape or else of different shapes. By way of example, all the projecting elements 130 can have a trapezoidal or alternatively a triangular shape relative to the sectional illustration. The specific shape of the projecting elements can be chosen according to the requirements that arise for example as a result of the semiconductor chip to be applied. By way of example, a composite semiconductor component 10 can contain a red-emitting LED, a green-emitting LED and a blue-emitting LED. The red LED can be arranged in the semiconductor chip $200_1$, for example. As is shown in FIG. 4A, the projecting elements 130 contacting the semiconductor chip $200_1$ have a trapezoidal shape, the lateral dimension of which at a position on the side of the semiconductor chip 200 is somewhat smaller than its lateral dimension on the side of the carrier substrate 100. As a result, for example, the mechanical stability of the red LED chip $200_1$ can be increased. In comparison therewith, the projecting elements 130 that respectively contact the semiconductor chips $200_2$ and $200_3$ taper to a greater degree.

Figure 4B:
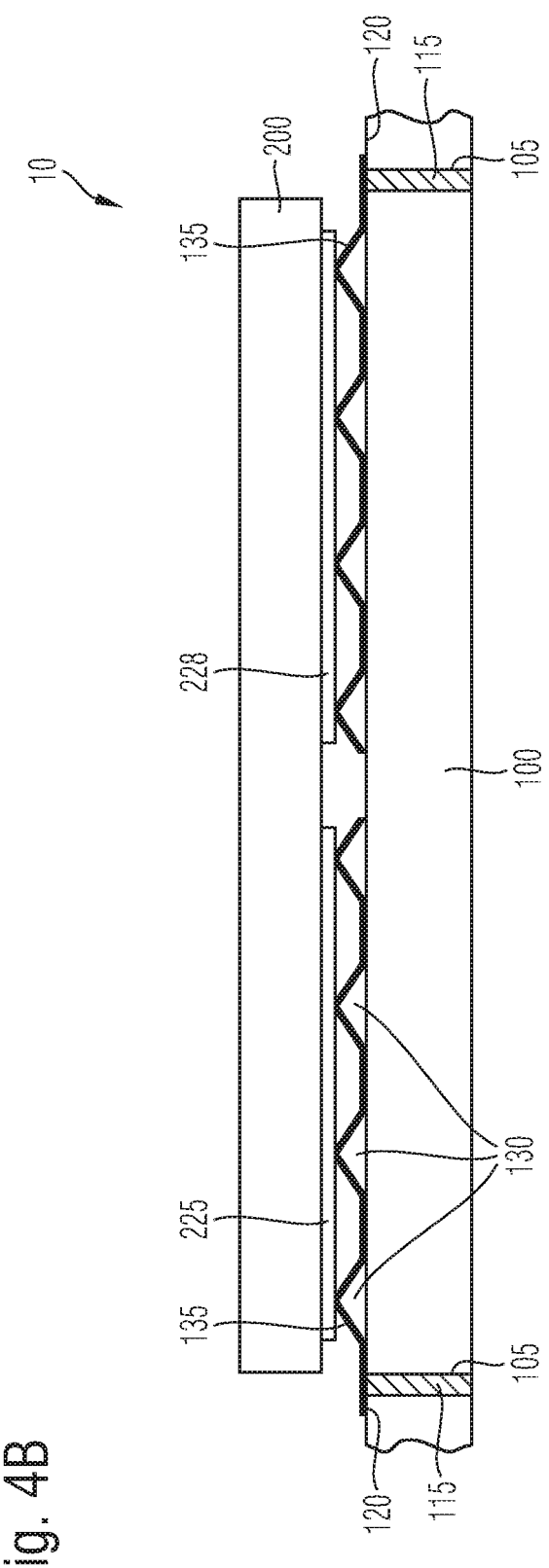
FIG. 4B shows a cross-sectional view of a composite semiconductor component in accordance with further embodiments.

As is illustrated in FIG. 4B, in each case a plurality of projecting elements 130 can be provided for each contact pad 225, 228. The projecting elements 130 assigned to a contact pad 225, 228 can be electrically conductively connected to a contact region 120 in each case by way of a conductive material 135.

In accordance with the embodiment illustrated in FIG. 4C, before the projecting elements 130 are formed, a depression 150 can be formed in the carrier substrate 100. By way of example, the depression 150 can be formed in a rectangular fashion around the semiconductor chip 200 and can surround the latter in a "ringlike" manner. As a consequence, the adhesive 140 can be prevented from running away or emerging. By way of example, a depth of the depression 150 can be approximately 0.5 µm to 5 µm.

The presence of the projecting elements makes it possible to form a reliable electrical connection between the semiconductor chips and the carrier substrate independently of the chip size and/or the number of terminals. Overall, as a result of the connection technique described, an increased flexibility is achieved and an improved electrical contact between semiconductor chips and carrier substrate is achieved. In addition, given appropriate formation of the projecting elements, the mechanical stability of the arrangement can be increased and the heat dissipation can be improved.

Figure 5:
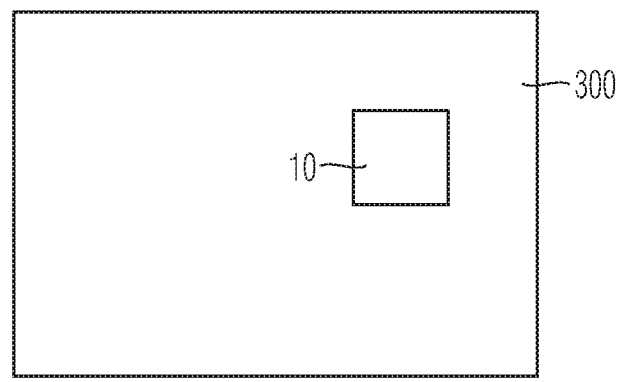
FIG. 5 shows a schematic view of an electrical device in accordance with one or more embodiments.

FIG. 5 shows one example of an electrical device 300. The electrical device 300 contains the composite semiconductor component 10 described. The electrical device 300 can be selected for example from a group comprising a photovoltaic, photonic, data storage, sensor, illumination, biomimetic and biocompatible device. By way of example, the electrical device can also be an electronic device having a large area. In accordance with further examples, the electrical device 300 can be a display device or a part of a display device in which individual LED chips are arranged on a drive circuit for driving the respective LED chips.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed herein. Therefore, the invention is restricted only by the claims and the equivalents thereof.

The invention claimed is:

1. A composite semiconductor component comprising:
a carrier substrate comprising a projecting element projecting from a first main surface of the carrier substrate, the projecting element comprising an electrically conductive material electrically conductively connected to a contact region of the carrier substrate and directly adjoining the contact region, wherein an aspect ratio of a diameter to a height of the projecting element is 0.3 to 3, and wherein the carrier substrate is composed of a semiconductor material; and
a semiconductor chip comprising at a first surface at least one contact pad that is electrically connected to the electrically conductive material of the projecting element,
wherein the semiconductor chip is arranged on the carrier substrate,
wherein, at a position at which the contact pad directly adjoins the electrically conductive material of the projecting element, the contact pad has a larger lateral extent than the projecting element,
wherein the carrier substrate comprises further projecting elements composed of an insulating material,
wherein the electrically conductive material is arranged as a structured layer over selected projecting elements, and
wherein a portion of the further projecting elements are electrically disconnected from the semiconductor chip.

2. The composite semiconductor component of claim 1, further comprising an adhesive arranged between the semiconductor chip and the carrier substrate, wherein the adhesive connects the semiconductor chip and the carrier substrate.

3. The composite semiconductor component of claim 1, wherein the semiconductor chip contains active regions of an optoelectronic component that have been detached from a growth substrate.

4. The composite semiconductor component of claim 1, wherein at least two projecting elements are provided per contact pad of the semiconductor chip.

5. The composite semiconductor component of claim 1, wherein at least one of the projecting elements is arranged at a position outside the contact pads of the semiconductor chip.

6. The composite semiconductor component of claim 1, wherein the first main surface of the carrier substrate comprises a depression, and wherein the projecting elements are positioned in the depression.

7. A method for producing a composite semiconductor component comprising a carrier substrate composed of a semiconductor material and a semiconductor chip, the method comprising:
forming a projecting element that projects from a first main surface of the carrier substrate, that comprises an electrically conductive material electrically conductively connected to a contact region of the carrier substrate and that directly adjoins the contact region, wherein an aspect ratio of a diameter to a height of the projecting element is 0.3 to 3 therefore providing a workpiece surface;
forming further projecting elements composed of an insulating material;
forming an adhesive layer over the workpiece surface;
joining together the carrier substrate with the semiconductor chip, the semiconductor chip having at least one contact pad at a first surface; and
curing the adhesive layer,
wherein the electrically conductive material of the projecting element is electrically connected to an associated contact pad of the semiconductor chip,
wherein the electrically conductive material is arranged as a structured layer over selected projecting elements,
wherein a portion of the further projecting elements are electrically disconnected from the semiconductor chip, and
wherein, at a position at which the contact pad and the electrically conductive material of the projecting element are in contact with one another, the contact pad has a larger lateral extent than the projecting element.

8. The method of claim 7, wherein forming the projecting element comprises applying the electrically conductive material at predetermined positions.

9. The method of claim 7, wherein first surfaces of a plurality of semiconductor chips are joined together simultaneously with the carrier substrate by a micro-transfer method.

10. A composite semiconductor component comprising:
a carrier substrate comprising a projecting element projecting from a first main surface of the carrier substrate, the projecting element comprising an electrically conductive material electrically conductively connected to a contact region of the carrier substrate and directly adjoining the contact region, wherein the carrier substrate is composed of a semiconductor material; and
a semiconductor chip comprising at a first surface at least one contact pad that is electrically connected to the electrically conductive material of the projecting element,
wherein the semiconductor chip is arranged on the carrier substrate,
wherein, at a position at which the contact pad directly adjoins the electrically conductive material of the projecting element, the contact pad has a larger lateral extent than the projecting element,
wherein the carrier substrate comprises further projecting elements composed of an insulating material,
wherein the electrically conductive material is arranged as a structured layer over selected projecting elements, and
wherein a portion of the further projecting elements are electrically disconnected from the semiconductor chip.

11. The composite semiconductor component of claim 10, further comprising an adhesive arranged between the semiconductor chip and the carrier substrate, wherein the adhesive connects the semiconductor chip and the carrier substrate.

12. The composite semiconductor component of claim 10, wherein the semiconductor chip contains active regions of an optoelectronic component that have been detached from a growth substrate.

13. The composite semiconductor component of claim 10, wherein at least two projecting elements are provided per contact pad of the semiconductor chip.

14. The composite semiconductor component of claim 10, wherein at least one of the projecting elements is arranged at a position outside the contact pads of the semiconductor chip.

15. The composite semiconductor component of claim 10, wherein the first main surface of the carrier substrate comprises a depression, and wherein the projecting elements are positioned in the depression.

* * * * *